(12) United States Patent
Choi et al.

(10) Patent No.: US 11,964,421 B1
(45) Date of Patent: Apr. 23, 2024

(54) METHOD AND SYSTEM FOR LOADING A SUPERSTRATE ONTO A SUPERSTRATE CHUCK

(71) Applicant: CANON KABUSHIKI KAISHA, Tokyo (JP)

(72) Inventors: Byung-Jin Choi, Austin, TX (US); Masaki Saito, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/069,015

(22) Filed: Dec. 20, 2022

(51) Int. Cl.
*H01L 21/027* (2006.01)
*B29C 59/00* (2006.01)
*H01L 21/3105* (2006.01)

(52) U.S. Cl.
CPC ...... *B29C 59/002* (2013.01); *H01L 21/31058* (2013.01)

(58) Field of Classification Search
CPC ............. B29C 59/002; H01L 21/31058; H01L 21/683–6835; H01L 21/687; H01L 21/68714; H01L 21/68742; H01L 21/68778; H01L 21/682; H01L 21/68; G03F 7/00; B82Y 40/00

See application file for complete search history.

(56) References Cited

U.S. PATENT DOCUMENTS

| | | | |
|---|---|---|---|
| 6,305,677 B1 | 10/2001 | Lenz | |
| 6,805,054 B1 * | 10/2004 | Meissl | G03F 7/0002 396/428 |
| 2023/0030470 A1 * | 2/2023 | Shinozaki | H01L 21/68742 |

FOREIGN PATENT DOCUMENTS

| | | |
|---|---|---|
| JP | 2012-069900 A | 4/2012 |
| KR | 10-1681631 B1 | 12/2016 |

* cited by examiner

*Primary Examiner* — Jun S Yoo
(74) *Attorney, Agent, or Firm* — CANON U.S.A., INC. IP Division

(57) ABSTRACT

A method of loading a superstrate onto a superstrate chuck includes raising a plurality of pins located radially outward of a substrate chuck from a retracted position to a receiving position, placing the superstrate onto the plurality of pins while the plurality of pins are in the receiving position, and coupling the superstrate with the superstrate chuck while the superstrate is on the plurality of pins.

18 Claims, 11 Drawing Sheets

METHOD AND SYSTEM FOR LOADING A SUPERSTRATE ONTO A SUPERSTRATE CHUCK

BACKGROUND

Field of Art

The present disclosure relates to substrate processing, and more particularly, to planarization or imprinting of surfaces in semiconductor fabrication.

Description of the Related Art

Planarization and imprinting techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization reduces the impact of depth of focus (DOF) limitations, and improves critical dimension (CD), and critical dimension uniformity. In extreme ultraviolet lithography (EUV), planarization improves feature placement and reduces the impact of DOF limitations. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

One step in a planarization method includes loading a superstrate onto a superstrate chuck. However, certain loading methods, such as directly loading the superstrate onto the superstrate chuck using a robot arm has disadvantages including difficulty achieving accurate positioning, difficulty achieving target parallelism between the superstrate surface and the superstrate chuck surface, and difficulty limiting the amount of force being applied to the robot arm when being used to load the superstrate. Thus, there is a need in the art for a planarization method and system that provides for loading a superstrate onto a superstrate chuck while achieving accurate positioning, target parallelism, and liming the applied force.

SUMMARY

In an embodiment, a method of loading a superstrate onto a superstrate chuck includes raising a plurality of pins located radially outward of a substrate chuck from a retracted position to a receiving position, placing the superstrate onto the plurality of pins while the plurality of pins are in the receiving position, and coupling the superstrate with the superstrate chuck while the superstrate is on the plurality of pins.

In an embodiment, a superstrate loading system includes a superstrate chuck configured to hold a superstrate, a substrate chuck configured to hold a substrate, and a plurality of pins located radially outward of the substrate chuck. The plurality of pins are configured to raise from a retracted position to a receiving position. Each pin of the plurality of pins are angled such that an upper edge of each pin of the plurality of pins is closer to a center of the substrate chuck in the receiving position than in the retracted position.

In an embodiment, a method of unloading a superstrate from a superstrate chuck includes raising a plurality of pins located radially outward of a substrate chuck from a retracted position to a receiving position, contacting the superstrate with the plurality of pins while the plurality of pins are in the receiving position and while the superstrate is held by the superstrate chuck, and releasing the superstrate from the superstrate chuck while the superstrate is contacting the plurality of pins.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
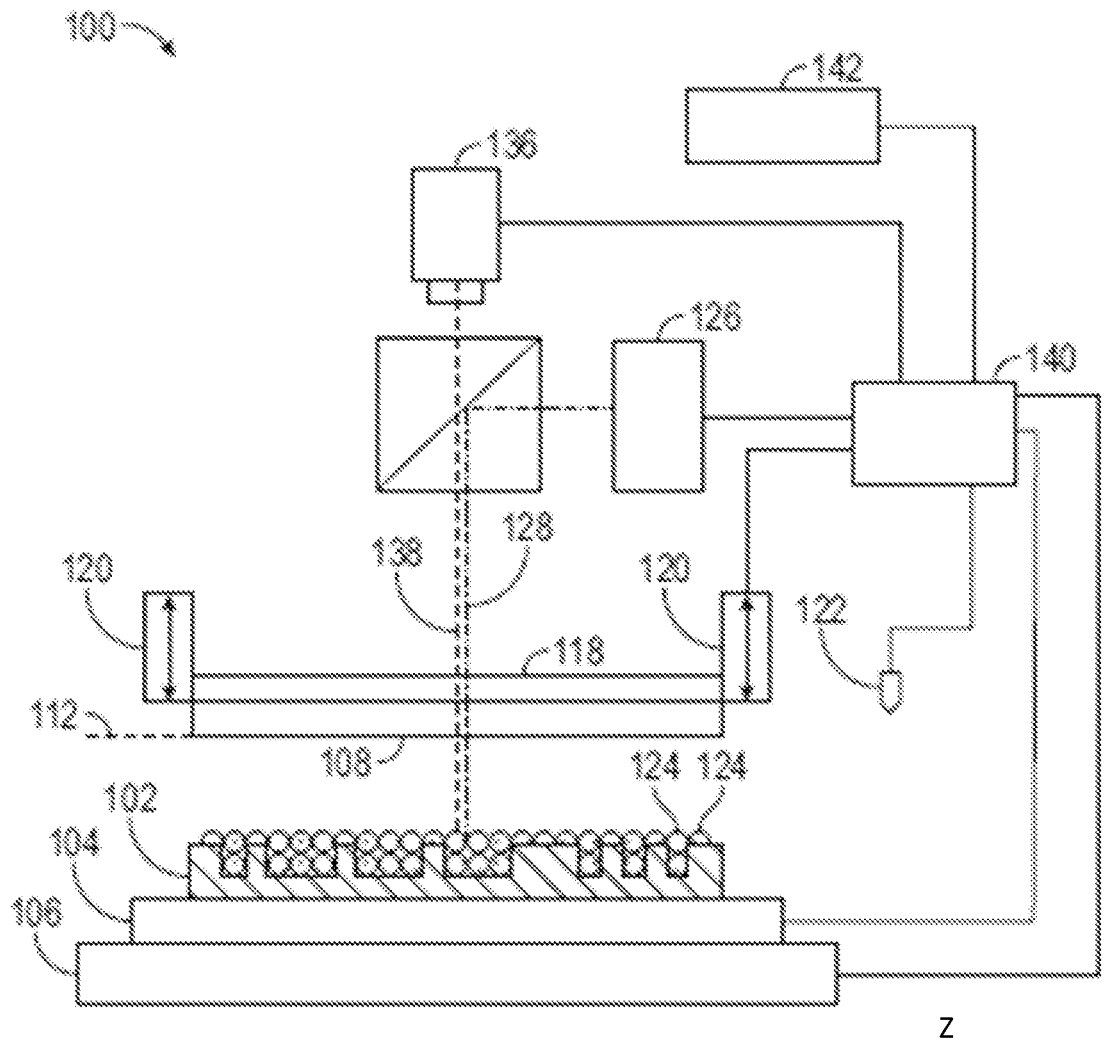
FIG. 1 is a schematic diagram illustrating an example planarization system in accordance with an aspect of the present disclosure.

FIG. 1 illustrates an example system for planarization in accordance with an aspect of the present disclosure. The planarization system 100 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like which are used for coupling the substrate 102 to the substrate chuck 104.

The substrate 102 and the substrate chuck 104 may be further supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. The working surface 112 is generally of the same areal size or slightly smaller as the surface of the superstrate 10.

The superstrate 108 may be coupled to or retained by a superstrate chuck assembly 118, which is discussed in more detail below. The superstrate chuck assembly 118 may be coupled to a planarization head 120 which is a part of the positioning system. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g. x-, y-, θ-, ψ-, and φ-axis). The superstrate chuck 118 may be a vacuum chuck, pin-type chuck, groove-type chuck, electrostatic chuck, electromagnetic chuck which has a mechanism which capable of coupling with the superstrate 108 without touching the working surface 112. Coupling of the superstrate 108 occurs when the chucking mechanism (for example vacuum, mechanical, electromagnetic, or electrostatic) of the superstrate chuck 118 grabs hold of the superstrate 108 and retains the superstrate 108. The superstrate 108 may also be decoupled by the reverse action of the chucking mechanism.

The planarization system 100 may further comprise a fluid dispenser 122. The fluid dispenser 122 may also be movably coupled to the bridge. In an embodiment, the fluid dispenser 122 and the planarization head 120 share one or more of all the positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The planarization system 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. FIG. 1 shows the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The planarization system 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the planarization system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the working surface 112 and the substrate surface.

The planarization system 100 may be regulated, controlled, and/or directed by one or more processors 140 (controller) in communication with one or more components and/or subsystems such as the substrate chuck 104, the substrate positioning stage 106, the superstrate chuck assembly 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

In operation, either the planarization head 120, the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate contacts and spreads droplets of the formable material 124 as further detailed herein.

Figure 2A:
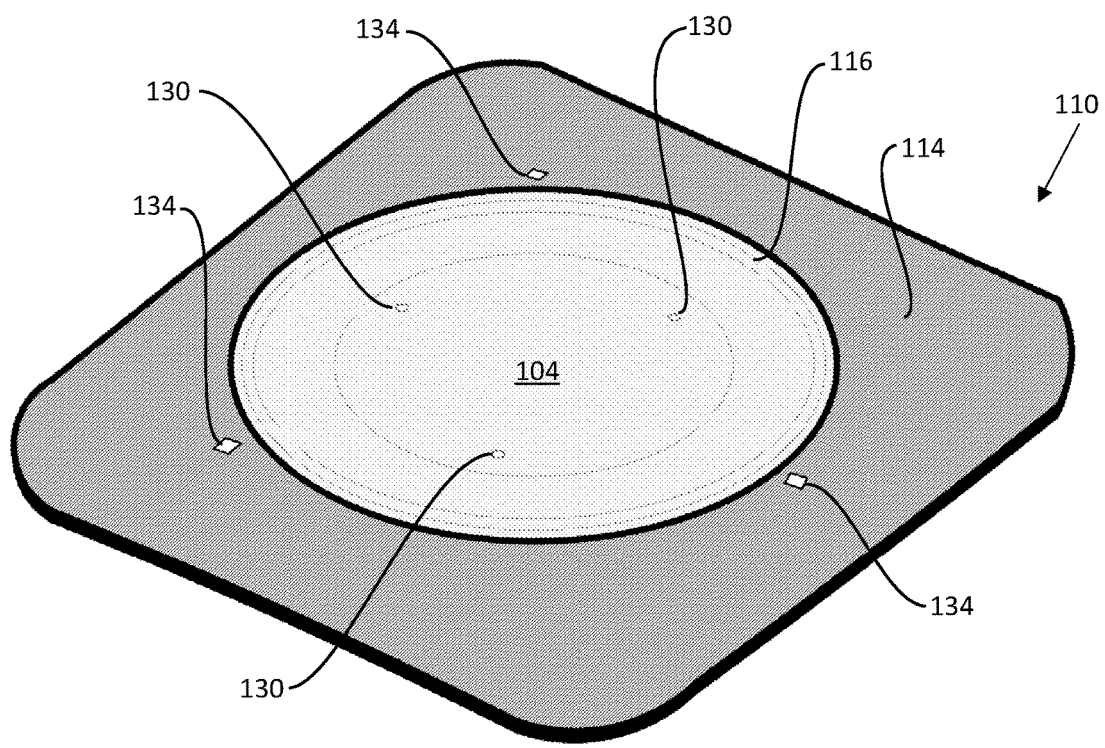
FIG. 2A shows a schematic perspective view of a frame and substrate chuck with pins in a retracted position in accordance with an aspect of the present disclosure.
Figure 2B:
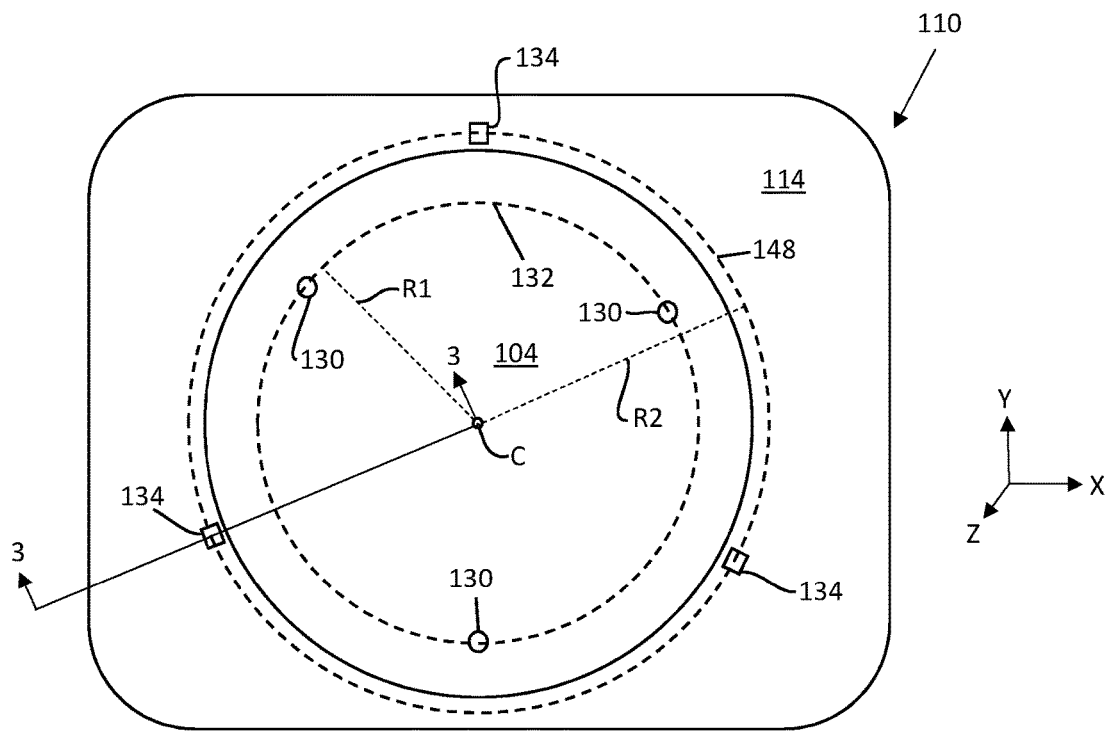
FIG. 2B shows a schematic top view of the frame and substrate chuck with pins in a retracted position in accordance with an aspect of the present disclosure.

While not shown in FIG. 1, the planarization system 100 may further include a frame 110 that partially surrounds the outer perimeter of the substrate chuck 104. FIG. 2A shows a schematic perspective view of the frame 110 and substrate chuck 104 in a first configuration. FIG. 2B shows a schematic top view of the frame 110 and substrate chuck 104 in the first configuration. As shown in FIG. 2A the frame 110 includes a body 114 defining a central opening 116. In the example aspect shown in FIG. 2A, the central opening 116 is circular and the body 114 is a square with rounded corners. The body 114 may have other shapes such as a rectangle, circle, etc. The central opening 116 surrounds a portion of the substrate chuck 104 and the substrate 102 when the substrate 102 is held by the substrate chuck 104. Thus, the central opening 116 should have a shape that compliments the outer perimeter of the substrate chuck 104 and/or the substrate 102. Because the outer perimeter of the substrate chuck 104 and the substrate 104 are generally circular in shape, the central opening 116 may also be circular.

The planarization system 100 may include a first plurality of pins 130 located in the substrate chuck 104. That is, the substrate chuck 104 may include the first plurality of pins 130. As best seen in FIG. 2B, the first plurality of pins 130 are radially/circumferentially aligned. That is, each pin of the first plurality of pins 130 have the same radial distance R1 from center point C of the substrate chuck 104 such that each pin of the first plurality of pins 130 intersect with a circle 132 having the radius R1. As shown in FIG. 2B, the first plurality of pins 130 are located radially inward of the outer edge of the substrate chuck 104. The first plurality of pins 130 may be configured to lift and retract in the Z direction only. That is, the first plurality of pins may move up and down in the Z dimension perpendicular to the surface of the substrate chuck 104/body 114 with movement in the X or Y dimensions. In other words, the first plurality of pins 130 are not angled relative to the surface of the substrate chuck 104/body 114. While three pins of the first plurality of pins 130 are illustrated, more than three or less than three pins may be included. For example, there may be 1 (if the single pin has a large contact area greater than 10% of the substrate area) to 10 pins of the first plurality of pins 130. In an alternative embodiment an arrangement of the first plurality of the pins 130 other than that illustrated may be used as long as the first plurality of the pins 130 perform the function of lifting and lowering the substrate 102 onto the substrate chuck 104.

The planarization system 100 may include a second plurality of pins 134 located in the body 114 of the frame 110. That is, the frame 110 may include the second plurality of pins 134. As best seen in FIG. 2B, the second plurality of pins 134 are radially/circumferentially aligned. That is, each pin of the second plurality of pins 134 have the same radial distance R2 from the center point C such that each pin of the second plurality of pins 134 intersect with a circle 148 having the radius R2 at the surface of the substrate chuck 104/body 114. As shown in FIG. 2B, the second plurality of pins 134 are located radially outward of the substrate chuck 104. The second plurality of pins 134 may be configured to lift and retract in the Z direction, but are also angled relative to the surface of the substrate chuck 104/body 114. The second plurality of pins 134 may be angled relative to the surface of the substrate chuck 104/body 114 such that an inner top edge 156 (FIGS. 3A to 3C) of each pin of the second plurality of pins 134 is closer to the center C in the radial direction than an inner bottom edge 157 (FIGS. 3A to 3C) of each respective pin. Because of the angle, as the second plurality of pins 134 move upwardly in the Z dimension, the top of each pin moves closer to the center C in the radial direction. While three pins of the second plurality of pins 134 is illustrated, more than three or less than three pins may be included. For example, there may be 2 (if the two pins have contact surfaces with a large annulus sector greater than 1°) to 10 pins of the second plurality of pins 134.

Figure 3A:
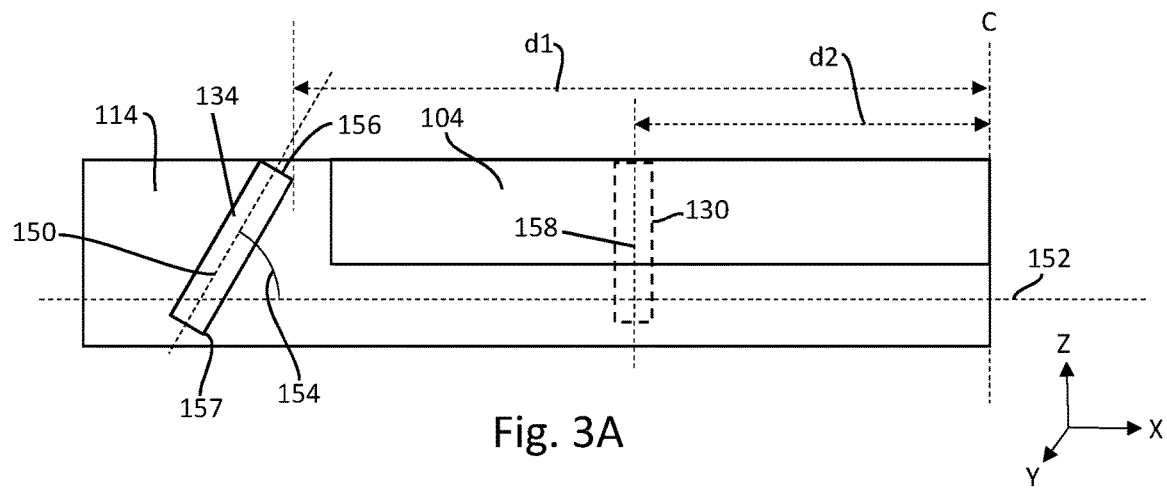
FIG. 3A shows a schematic partial cross section view of the frame and substrate chuck with pins in a fully retracted position in accordance with an aspect of the present disclosure.
Figure 3B:
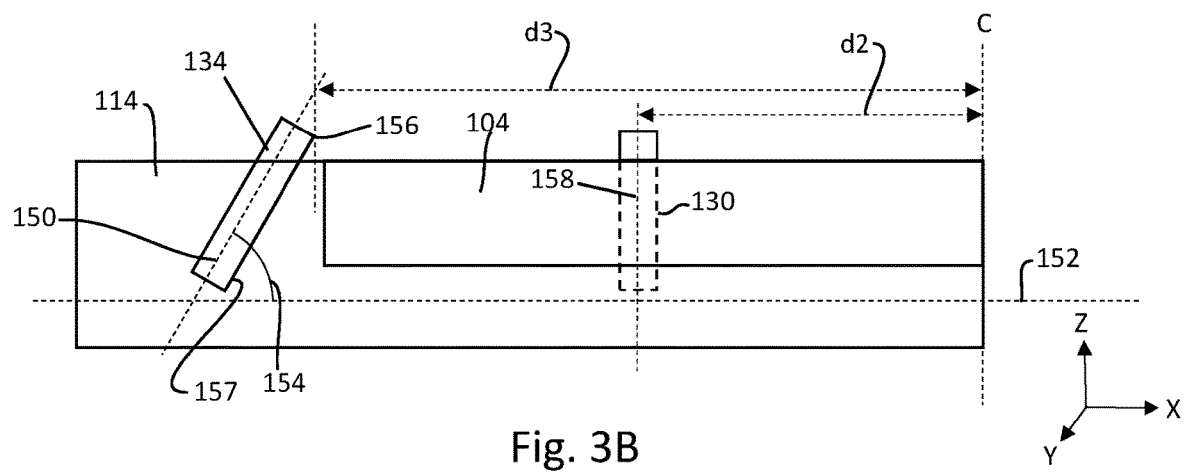
FIG. 3B shows a schematic partial cross section view of the frame and substrate chuck with pins in a partially extended position in accordance with an aspect of the present disclosure.
Figure 3C:
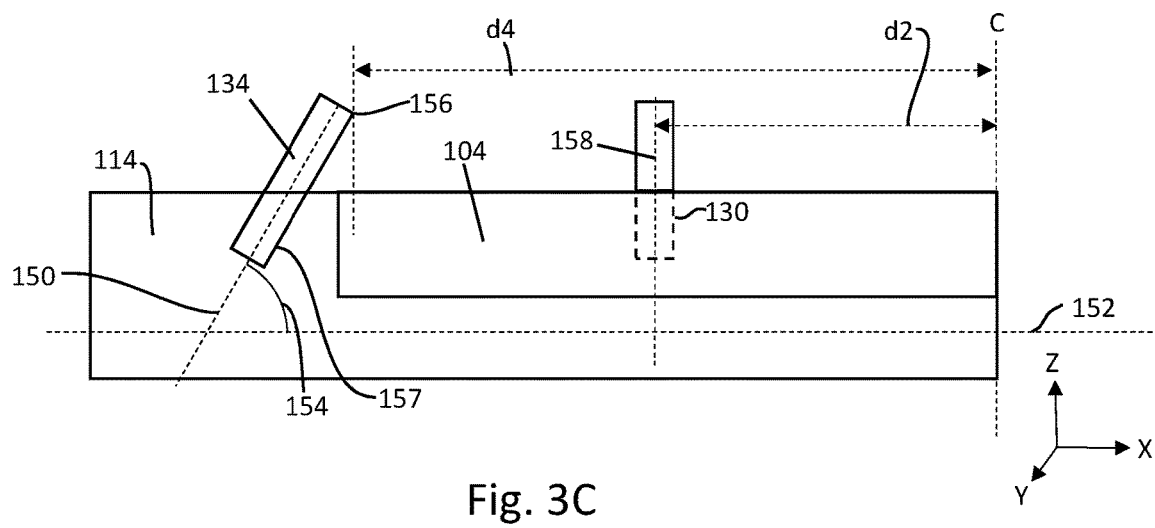
FIG. 3C shows a schematic partial cross section view of the frame and substrate chuck with pins in a fully extended position in accordance with an aspect of the present disclosure.

In the configuration of FIGS. 2A and 2B, both the first plurality of pins 130 and the second plurality of pins 134 are in a fully retracted state. FIGS. 3A to 3C show a schematic cross-sectional view of FIG. 2B taken along line 3-3 at different positions of the first plurality of pins 130 and second plurality of pins 134. FIG. 3A shows a configuration when both the first plurality of pins 130 and the second plurality of pins are fully retracted. FIG. 3B show a configuration when both the first plurality of pins 130 and the second plurality of pins 134 are partially extended. FIG. 3C shows a configuration where both the first plurality of pins 130 and the second plurality of pins 134 are in fully extended positions. FIGS. 3A to 3C show both sets of pins retracted and extended at the same time for purposes of illustration only. As will be made clear from the description below, when performing the method of loading a superstrate described herein, the two sets of pins are not retracted and extended at the same time. That is, while the system is capable of extending and retracting both sets of pins at the same time, because the sets of pins serve different purposes, they are actuated independently at different moments in time when performing the method of loading the superstrate. FIGS. 3A to 3C show both of the sets of pins retracted and extended together to allow for a more concise description.

Turning to FIG. 3A, as noted above, FIG. 3A shows the first plurality of pins 130 and the second plurality of pins 134 being fully retracted. In the fully retracted configuration, the first plurality of pins 130 are located completely within the substrate chuck 104. Similarly, in the fully retracted configuration, the second plurality of pins 134 are located completely within the body 114 of the frame 110.

As shown in FIGS. 3A to 3C, and noted above, the second plurality of pins 134 are angled. Specifically, a longitudinal axis 150 of each pin of the second plurality of pins 134 is angled relative to a horizontal plane 152 (i.e., an X-Y plane). The horizontal plane 152 is parallel to the surface of the body 114 of the frame 110 and also the surface of the substrate chuck 104. That is, there is an angle 154 between the longitudinal centerline 150 of each pin of the second plurality of pins 134 and the horizontal plane 152. The angle 154 may be from 10° to 60°. The second plurality of pins 134 are angled toward the center C such that the top of each pin is closer to the center C than the bottom of the pin in the radial direction. A distance d1 extends in the radial direction from an inner top edge 156 of the second plurality of pins 134 to the center C. The first plurality of pins 130, however, are not angled relative the horizontal plane 152. That is, as shown in FIGS. 3A to 3C, the first plurality of pins 130 has a longitudinal centerline 158 that is perpendicular to the plane 152, i.e., 90 degrees. A distance d2 extends from the longitudinal centerline 158 of the first plurality of pins 130 to the center C.

FIG. 3B shows a configuration where both of the first plurality of pins 130 and the second plurality of pins 134 are shown in a partially extended configuration. The pins 130, 134 may be caused to lift under the control of the controller 140. A translation mechanism known in the art may be used to cause the first plurality of pins 130 to lift only in the Z direction along while maintaining the perpendicular ordination. Similarly, another translation mechanism known in the art may be used to cause the second plurality of pins 134 to lift in the Z direction while maintaining the angle 154. The translation mechanism may generally include one or more of: an electric actuator; a solenoid; a motor; pneumatic actuator; a linear actuator; a translation stage; a stack actuator; a piezoelectric actuator; a mechanical linkage; a position encoder; sensors; etc. Each pin among the first and second plurality of pins (130, 134) may have an independent translation mechanism. In an alternative embodiment, a translation mechanism may include mechanical linkages which cause multiple pins to move at once. The translation mechanism is a device which causes one or more pins to move based on instructions from the controller 140. As shown in FIG. 3B, because the first plurality of pins 130 lift only straight up in the Z direction, the distance d2 from the longitudinal centerline 158 of the first plurality of pins 130 and the center C does not change as compared to the fully retracted position. However, because the second plurality of pins 134 has the angle 154 (i.e., the angle 154 does not change), the distance between the inner top edge 156 and the center C gets smaller as the second plurality of pins 134 extends. In particular, in the configuration shown in FIG. 3B, a distance d3 extends from the inner top edge 156 of the second plurality of pins 134 and the center C, where d3 is smaller than d2. Thus, as the second plurality of pins 134 raises, the top ends of the second plurality of pins 134 begin to move closer to the center C of the superstrate chuck 104.

FIG. 3C shows a configuration where both of the first plurality of pins 130 and the second plurality of pins 134 are shown in a fully extended configuration. The fully extended position is also referred herein as the receiving position. This is because once the pins are fully extended, they are in a state to receive an object. In the case of the first plurality of pins 130, the pins are in a state to receive a substrate. In the case of the second plurality of pins 134, the pins are in a state to receive a superstrate. As shown in FIG. 3C, because the first plurality of pins 130 lift only straight up in the Z direction, the distance d2 from the longitudinal centerline 158 of the first plurality of pins 130 and the center C is the same as compared to the fully retracted position. However, because the second plurality of pins 134 has the angle 154 (i.e., the angle 154 does not change), the distance between the inner top edge 156 and the center C gets even smaller as compared to the fully retracted position and the partially extended position. In particular, in the configuration shown in FIG. 3C, a distance d4 extends from the inner top edge 156 of the second plurality of pins 134 and the center C, where d4 is smaller than d3 and d1. For example, in an embodiment the distance d4 may be equal to X % (percent) of the distance d1 (i.e., d4=X % d1), where X is 93 to 98. In another embodiment X is 94 to 97. In another embodiment X is 95 to 96.

When reaching the fully extended position, due to the angle 154, the inner top edge 156 of the second plurality of pins 134 is above the substrate chuck 104. That is, the inner top edge 156 overlaps the substrate chuck 104 at a position above the substrate chuck 104. As will explained below in the method of loading the superstrate, at the moment in time that the second plurality of points 134 are fully extended a substrate will have already been loaded onto the substrate chuck 104. Thus, in the fully extended position, the inner top edge 156 of the second plurality of pins 134 also overlaps with the substrate.

Loading and Unloading of the Superstrate

Figure 4:
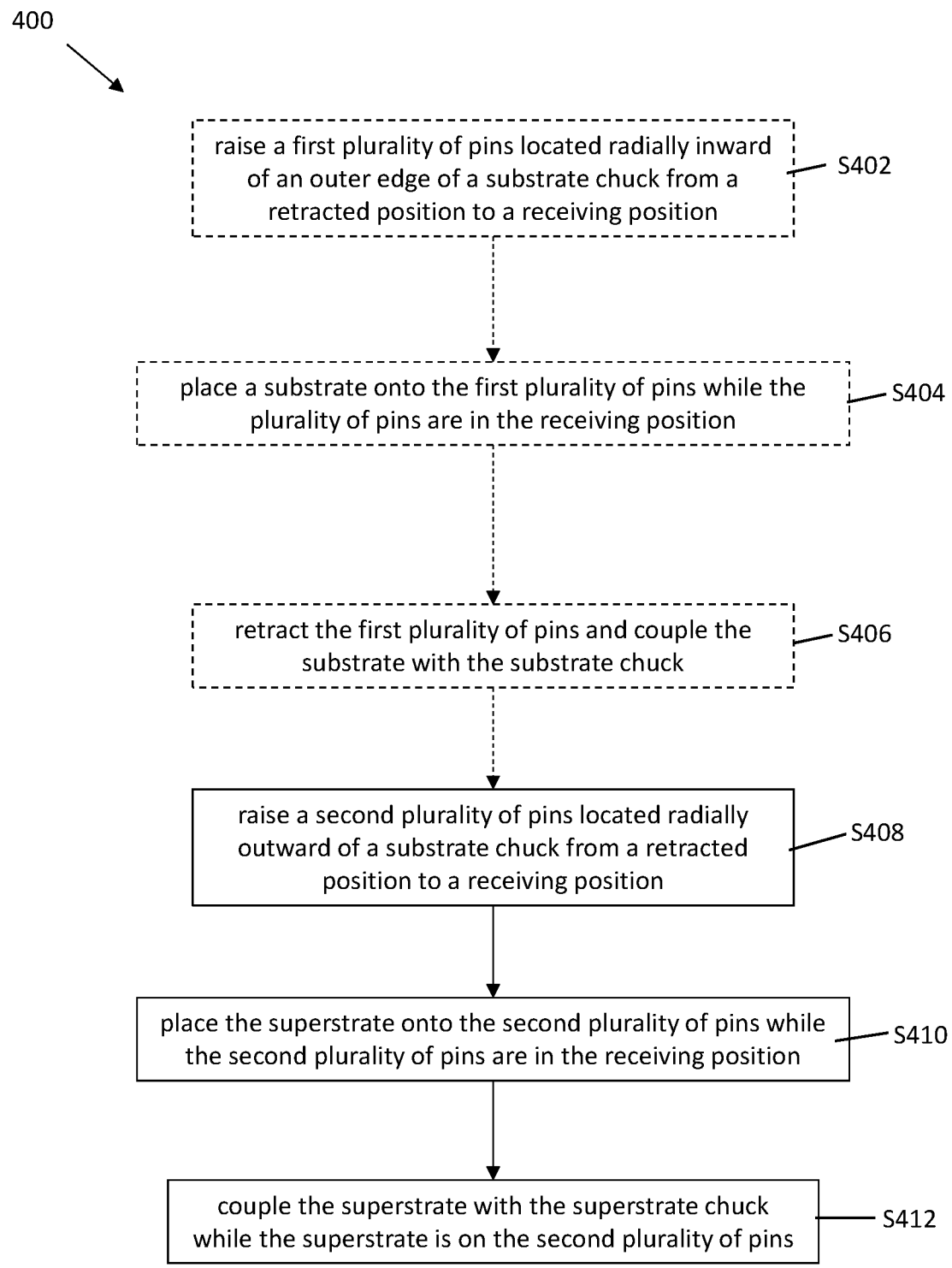
FIG. 4 shows a flow chart of an example superstrate loading method in accordance with aspect of the present disclosure.

FIG. 4 shows a flow chart of a method 400 of loading the superstrate 108 onto the superstrate chuck 118. FIGS. 5A to 5K show schematic partial cross sections of the frame 110/substrate chuck 104/pins 130, 134 system during the method 400 of FIG. 4. The method 400 of loading the superstrate 108 optionally includes steps S402 to S406 and includes steps S408 to S412. Steps S402 to S406 involve the process of loading a substrate to the substrate chuck using the first plurality of pins 130. These steps are optional because in one embodiment, the method of loading the superstrate may begin after the substrate has already been loaded. Alternatively, in another embodiment, the method of loading the superstrate 108 may include the steps of loading the substrate 102 as well. Alternatively, in another embodiment, the method of loading the superstrate 108 may include the steps S408-S412 of loading the superstrate 108 without a substrate 102 loaded onto the substrate chuck 104. The applicant has found that the performance of the planarization system 100 is improved if the loading the superstrate 108 is performed while the substrate chuck 104 is protected by a substrate 102.

Figure 5A:
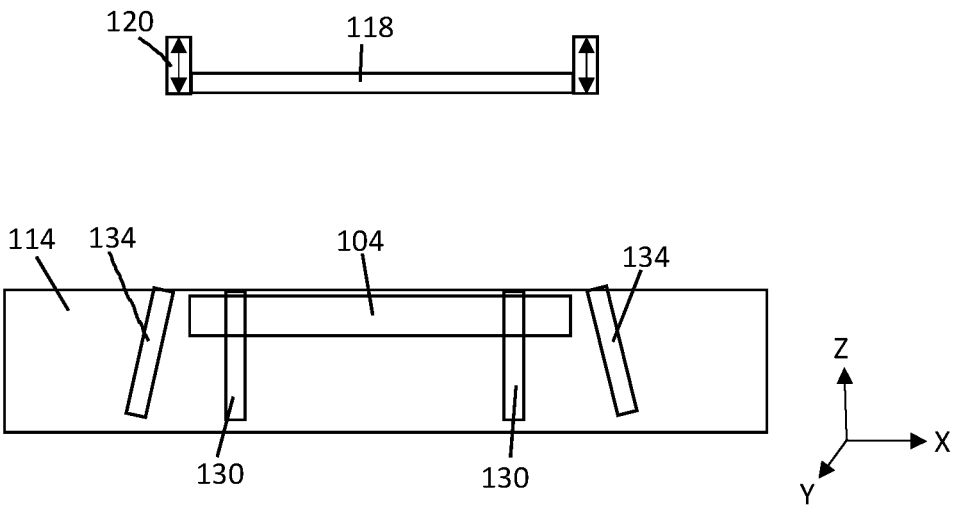
FIGS. 5A to 5K show a series of schematic cross sections of a portion of the loading method of FIG. 4 in accordance with aspect of the present disclosure.
Figure 5B:
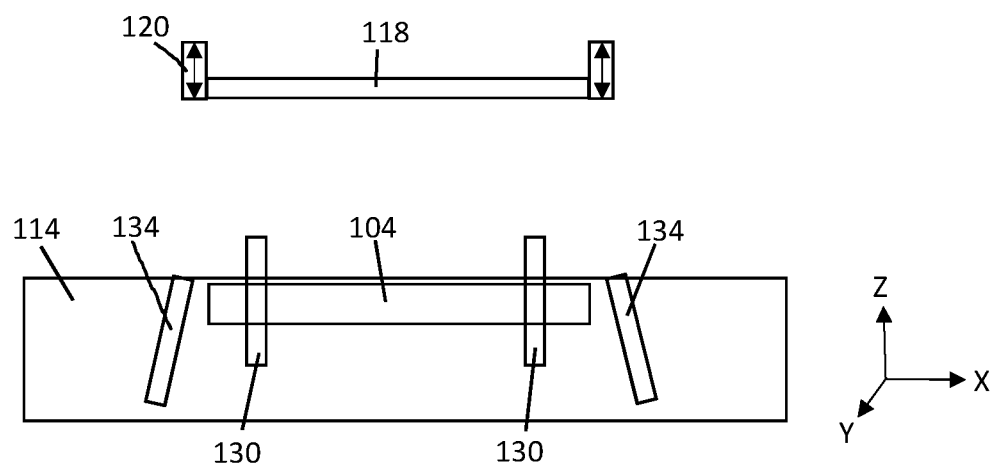

In the case of the loading of the substrate 102 being part of the method of loading the superstrate 108, the method 400 begins at step S402 where the first plurality of pins 130 (being located radially inward of the outer edge of the substrate chuck 104) are raised from a retracted position to a receiving position. FIG. 5A shows a schematic partial cross section of the system at the moment just before step S402. As seen in FIG. 5A both the first plurality of pins 130 and the second plurality of pins 134 are in the fully retracted position. The superstrate chuck 118 is a distance above the substrate chuck 104. FIG. 5B shows the moment right after S402 has been performed. As shown in FIG. 5B, the first plurality of pins 130 have been raised to the fully extended/receiving position.

The method may then proceed to step S404 where a substrate 102 is placed onto the first plurality of pins 130 while the first plurality of pins 130 are in the receiving position. The substrate 102 used in this case is also known as a cap substrate. This is because the substrate 102 being placed at this moment is not used during the actual fabrication and no formable material is dispensed on this substrate. The cap substrate is used to prevent any particle contaminants that may be produced during the subsequent steps from collecting on the substrate chuck 104. In general, whenever components are moved (for example, the superstrate), there is the possibility of particles being shed. If the particle contaminants reach the substrate chuck, errors can be introduced into the fabrication process. Thus, the cap substrate can avoid such errors by preventing the particle contaminates from reaching the substrate chuck. Once the system is ready for an actual substrate on which formable material will be dispensed (i.e., after the superstrate has been coupled with the superstrate chuck), the cap substrate is removed.

Figure 5C:
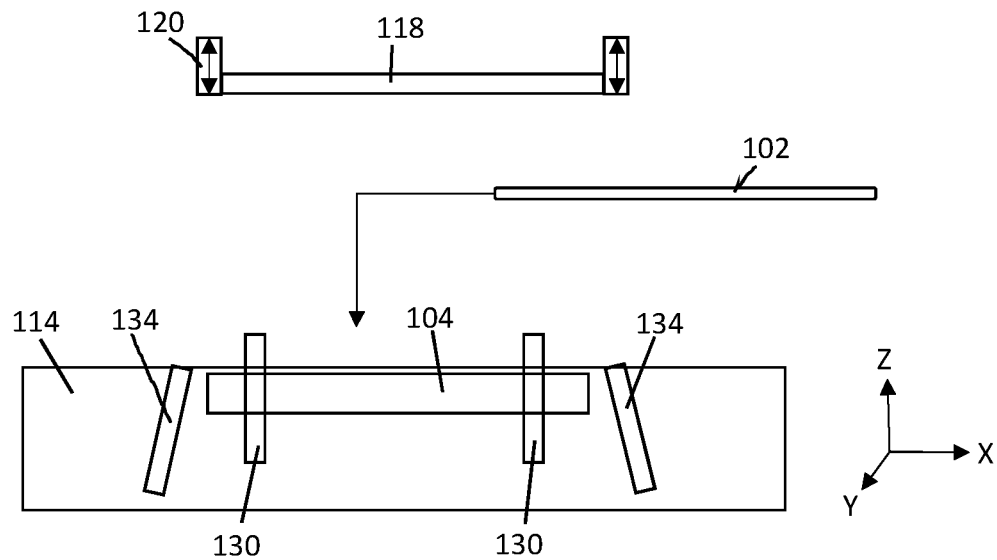
Figure 5D:
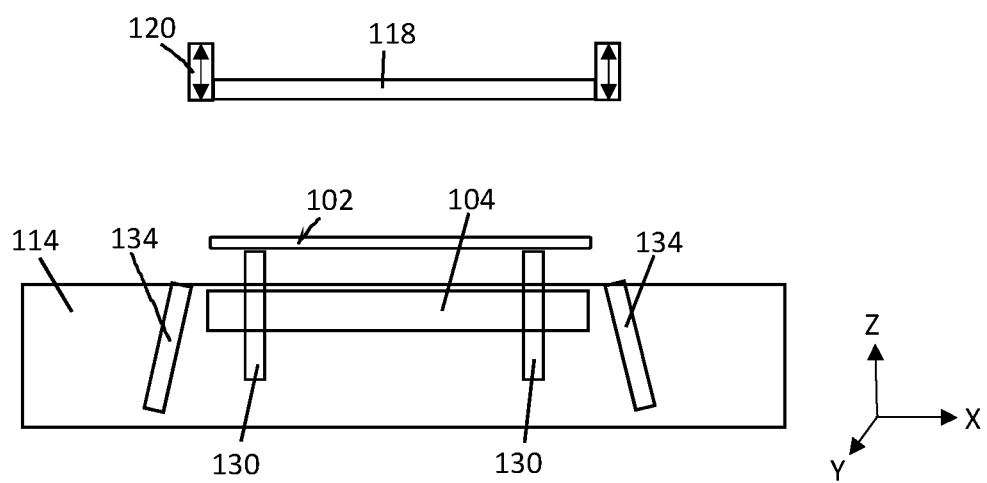

FIG. 5C shows a moment as the substrate 102 is being brought onto the first plurality of pins 130. As shown in FIG. 5C, the substrate 102 enters into the space above the first plurality of pins 130. The substrate 102 may be carried and placed using a robot arm (not shown) having an end effector for holding the substrate 102. FIG. 5D shows the moment after the completion of step S404. As shown in FIG. 5D the robot arm has placed the substrate 102 onto the first plurality of pins 130 while the first plurality of pins 130 are in the receiving position. That is, the top of the first plurality of pins 130 are contacting the underside surface of the substrate 102 and the first plurality of pins 130 remain fully extended.

Figure 5E:
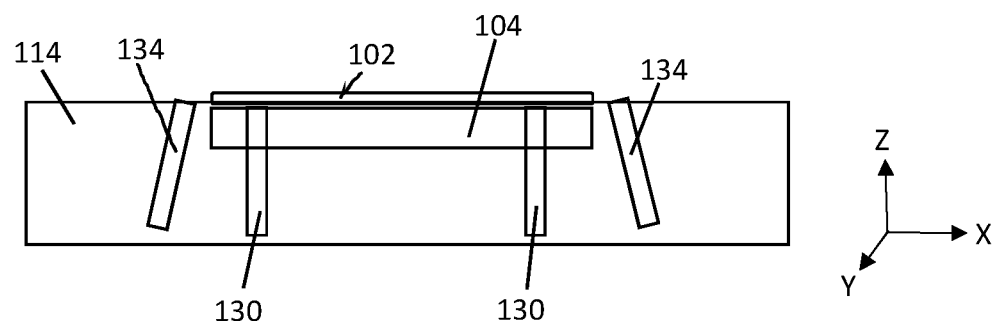

The method 400 may then proceed to step S406 where the first plurality of pins 130 are retracted and the substrate 102 is coupled with the substrate chuck 104. FIG. 5E shows the moment after step S406 has been performed. As shown in FIG. 5E, the first plurality of pins 130 has been lowered and returned to the fully retracted position. By fully retracting the first plurality of pins 130, the substrate 102 is lowered onto the substrate chuck 104.

As discussed above, and as seen throughout FIGS. 5A to 5E, because the first plurality of pins 130 raise only up/down in the Z dimension and are perpendicular to the horizontal X-Y plane that is parallel to the surface of the body 114 of the frame 110 (i.e., are not angled like the second plurality of pins), the first plurality of pins 130 are always the same radial distance d2 from the center C no matter what position the first plurality of pins 130 are in.

Figure 5F:
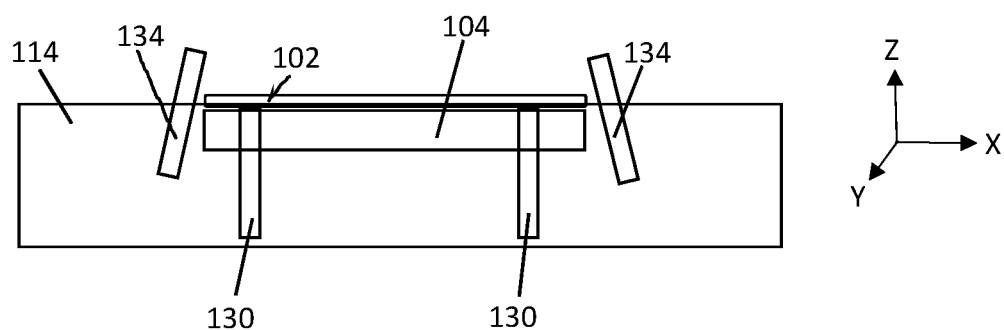

The method 400 may then proceed to step S408, which is the first step of the method in the embodiment where step S402 to S406 are not performed. In step S408, the second plurality of pins 130 (located radially outward of a substrate chuck 104) are raised from the retracted position to a receiving position. For all of the above-described steps up through FIG. 5E, the second plurality of pins 134 are fully retracted. That is, the second plurality of pins 134 are located completely within the body 114 of the frame 110. FIG. 5F shows the moment after step S408 has been performed and the second plurality of pins 134 are now extended out of the body 114 of the frame 110 and are in the receiving position. FIG. 5F corresponds to the same configuration shown in FIG. 3C. As noted above, and as demonstrated by the order of the method steps S402 to S408, the movement of the first plurality of pins 130 occurs entirely before the movement of the second plurality of pins 134. Thus, in FIG. 5F when the second plurality of pins 134 are extended, the first plurality of pins 130 are retracted. As shown in more detail in FIG. 3C, due to the angle 154, at the moment shown in FIG. 5F, the inner top edge 156 of the second plurality of pins 134 is above and overlaps the substrate 102. That is, unlike the first plurality of pins 130, the inner top edge 156 of the second plurality of pins 134 gets closer to the center C as the second plurality of pins 134 move toward the extended/receiving position.

Figure 6A:
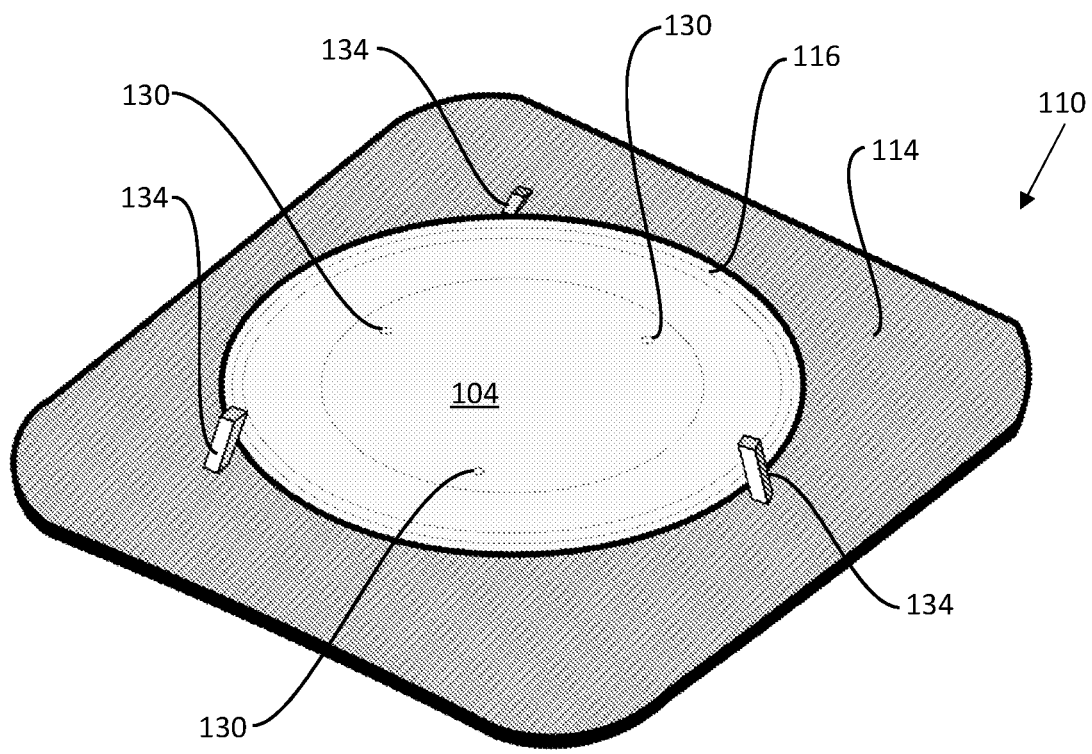
FIG. 6A shows a schematic perspective view of the frame and substrate chuck with pins in fully extended position in accordance with aspect of the present disclosure.

FIG. 6A shows a schematic perspective schematic view of the same moment shown in FIG. 5F, with omissions for clarity. In particular, both the superstrate chuck 118 and the substrate 102 are omitted. As shown in FIG. 6A, the first plurality of pins 130 are fully retracted and are not visible, while the second plurality of pins 134 are fully extended. The second plurality of pins 134 are angled as discussed above and a portion of each extends above and overlaps with the substrate chuck 104 and the substrate (not shown).

Figure 5G:
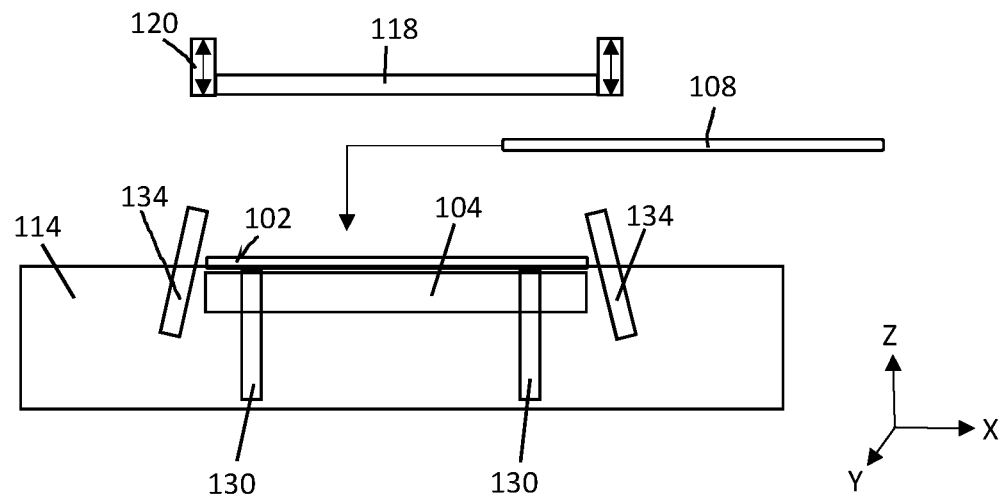
Figure 5H:
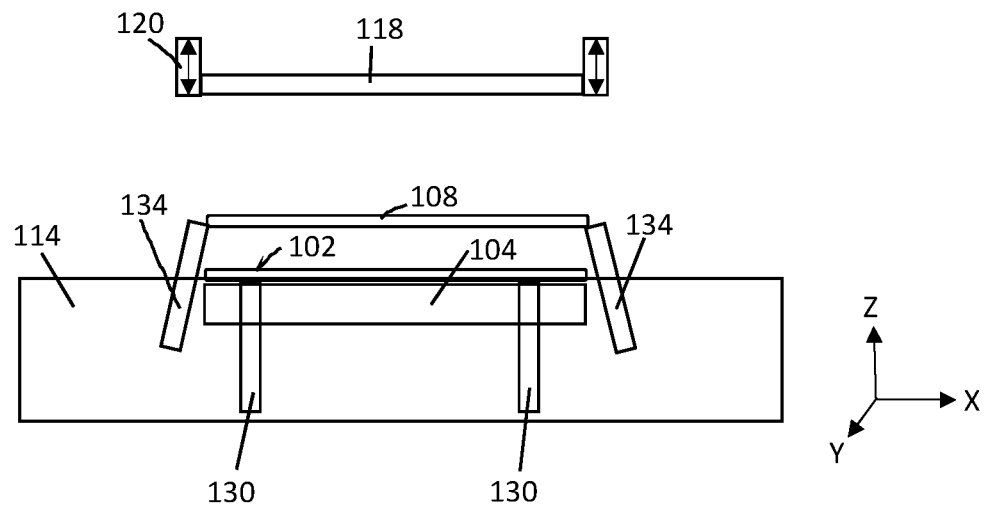

After the completion of step S408, the method may proceed to step S410 where the superstrate 108 is placed onto the second plurality of pins 134 while the second plurality of pins 134 are in the extended/receiving position. FIG. 5G shows the moment as the superstrate 108 is being brought into the area above the substrate chuck 102 and brought down onto the second plurality of pins 134. The superstrate 108 may be carried by a robot arm with end effector for holding the superstrate 108. The robot arm with end effector can be the same or different from the robot arm with end effector that carried the substrate 102. FIG. 5H shows the moment after the completion of step S410. The robot arm may be configured to hold the superstrate 108 without touching the working surface 112. As shown in FIG. 5H the robot arm has placed the superstrate 108 onto the second plurality of pins 134 while the second plurality of pins 134 are in the receiving position. In particular, the inner top edge 156 of each pin of the second plurality of pins 134 (which is over the substrate 102), are contacting the underside surface of the superstrate 108 while the second plurality of pins 134 remain fully extended. In an embodiment, the applicant has found that the performance of the planarization system is improved if the second plurality of pins 134 are configured to not touch the working surface 112 when holding the superstrate 102. In an embodiment, the second plurality of pins 134 are configured to minimize contact with the working surface 112.

Figure 6B:
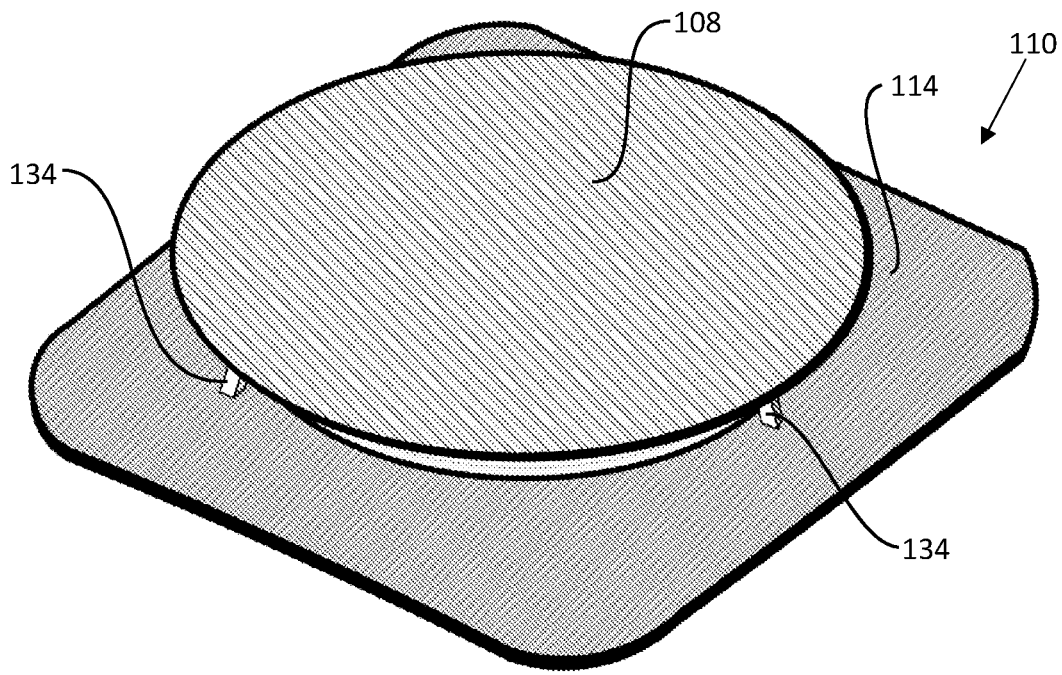
FIG. 6B shows a schematic perspective view of a superstrate on the pins in fully extended position in accordance with aspect of the present disclosure.

FIG. 6B shows a perspective schematic view of the same moment shown in FIG. 5H, with omissions for clarity. In particular, both the superstrate chuck 118 and the substrate 102 are omitted. As shown in FIG. 6B, the superstrate 108 has been placed on the second plurality of pins 134 in the extended/receiving position. The superstrate 108 is thus above the superstrate chuck 104 and above the substrate 102 (not shown).

In the illustrated example embodiment, all of the steps up to S410 occur underneath the superstrate chuck 118. That is, in the illustrated example embodiment, the superstrate 108 is already underneath the superstrate chuck 118 before step S410 has been completed. However, in another embodiment, any or all of steps S402 to S410 may be performed at a different location that is not underneath the superstrate chuck 118. In such an embodiment, the frame 110/substrate chuck 104 carrying the superstrate 108 on the second plurality of pins 134 may be moved to a position underneath the superstrate chuck 118 using for example the substrate positioning stage 106. Either way, the frame 110/substrate chuck 104 carrying the superstrate 108 on the second plurality of pins 134 ends up in the position shown in FIG. 5H before moving on to step S412.

Figure 5I:
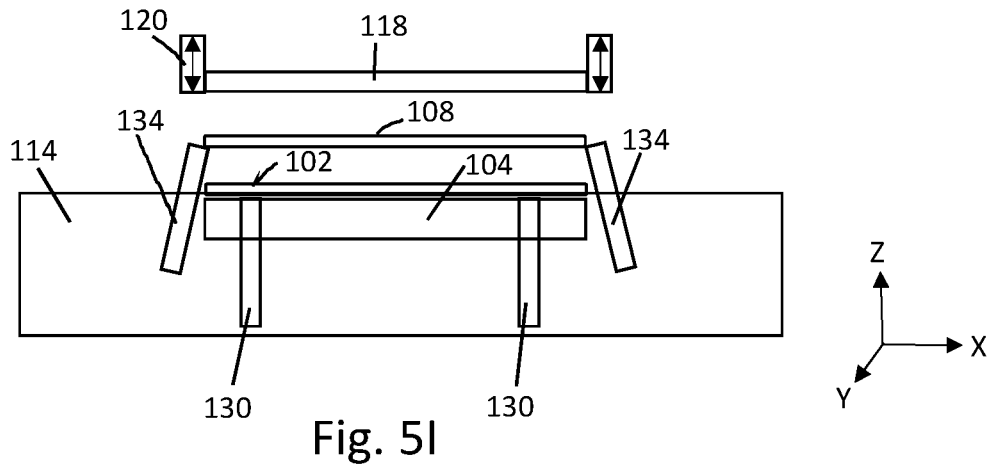
Figure 5J:
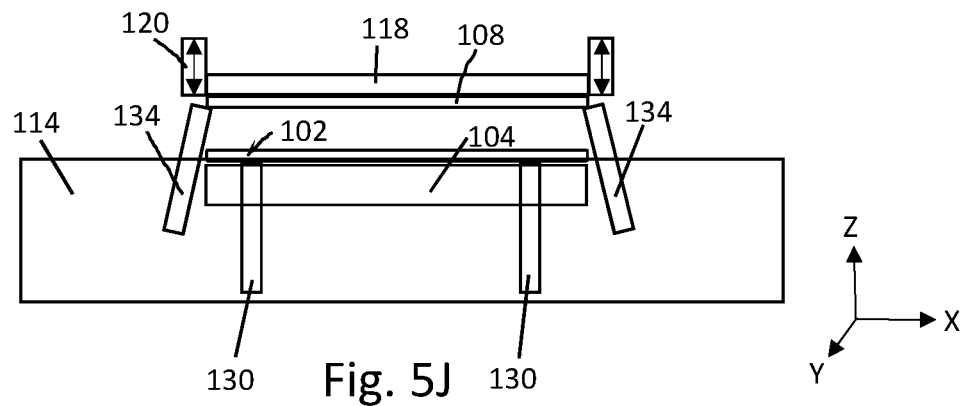
Figure 5K:
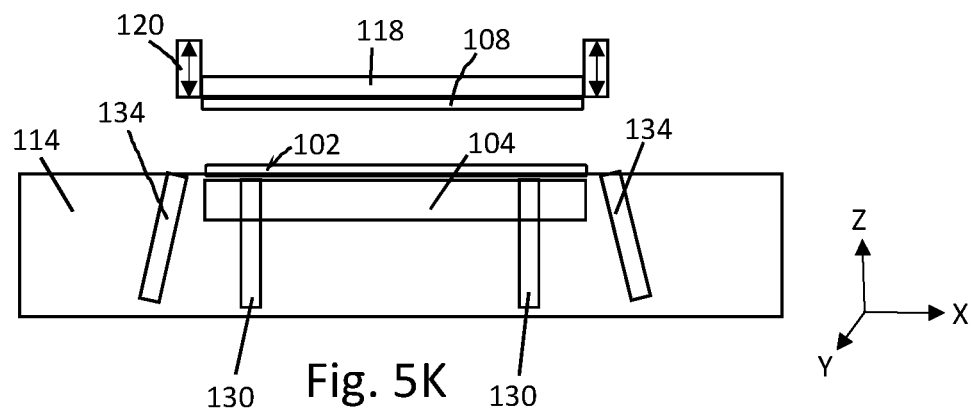

Next, the method may proceed to step S412 where the superstrate 118 is coupled with the superstrate chuck 118 while the superstrate 108 is on the second plurality of pins 134. Step S412 is shown in FIGS. 5I and 5J. As part of the step S412, the distance between the superstrate chuck 118 and the superstrate 108 on the second plurality of pins 134 may be reduced. This may be performed by lifting the frame 110/substrate chuck 104 toward the superstrate chuck 118, by moving the superstrate 118 toward the superstrate chuck 108, or performing both movements at the same time. FIG. 5I shows a moment where distance between the superstrate 118 and the superstrate chuck 108 have been reduced, but not yet at the point where the superstrate 118 is contacting the superstrate chuck 108. The distance between the superstrate 108 and the superstrate chuck 118 may continue to be reduced until the upper side of the superstrate 108 comes into contact with the superstrate chuck 118 or just below the superstrate chuck 118. This position is also known as the chucking position. The chucking position is shown in FIG. 5J. Once the superstrate 108 is in contact with (or just below) the superstrate chuck 118, i.e., at the chucking position, the superstrate 108 may be coupled with the superstrate chuck 118 in any manner known in the art. For example, a vacuum in the superstrate chuck 118 may be implemented to hold the superstrate 108 onto the superstrate chuck 118 thus coupling the superstrate 108 with the superstrate chuck 118. In the case of the superstrate 108 being just below the superstrate chuck 118, it is still close enough that the vacuum is able to suction the superstrate 108 off of the second plurality of pins 138. In the case where only the superstrate chuck 118 moves toward a stationary substrate chuck 104, the receiving position of the second plurality of pins 134 is also the chucking position.

While FIGS. 5I and 5J illustrate an embodiment in which the distance between the superstrate chuck 118 and the superstrate 108 is reduced, in another example embodiment, the reducing of the distance can be avoided. For example, in another embodiment, the position of the frame 110 and substrate chuck 104 may be positioned in the Z dimension such that the fully extended position of the second plurality of pins 134 is precisely at a position where the upper side of the superstrate 108 is contacting or just below the superstrate chuck 118. In this case, the receiving position of the second plurality of pins 134 is not at the fully extend position. Rather, the receiving position is below the fully extended position, where the superstrate 108 is placed on the second plurality of pins 134 when the second plurality of pins 134 are below the fully extended position. Once the superstrate 108 is placed on the second plurality of pins 134, the second plurality of pins may be further extended to the fully extended position. That is, the relative position of the frame 110 and substrate chuck 104 in the Z dimension is precisely positioned so that when the second plurality of pins 134, having the superstrate 108 already placed thereon, is fully extended, the final position of the superstrate 108 is at the same chucking position described above. Accordingly, in a case where the fully extended position of the second plurality of pins 134 places the superstrate 108 at the chuck position, there is no need to reduce the distance between the superstrate chuck 118 or the frame 110/substrate chuck 104 in the Z dimension.

In either case of using the second plurality of pins 134 to position the superstrate 108 at the chucking position or moving the superstrate chuck 118/frame 110/substrate chuck 104, a sensor (not shown) may be included to measure the precise position of the superstrate 108 relative to the superstrate chuck 118. More specifically, the sensor may detect the precise X and Y dimension position of the superstrate 108 relative to the X and Y dimension position of the superstrate chuck 118. Using this detected information, the positioning stage 106 can be moved to precisely line up the superstrate 108 with the superstrate chuck 118. In an embodiment the camera 136 is used as the sensor for detecting the position of the superstrate 108. In an alternative embodiment, a dedicated sensor either above or below the superstrate may be used to identify edges of the superstrate 108. The superstrate position detection sensor can be one or more of 2D laser sensor, probe-type optical sensor or camera imaging unit.

Another aspect of the present disclosure is a method of unloading the superstrate 108 from the superstrate chuck 118. The method of unloading the superstrate 108 from the superstrate chuck 118 is essentially the reverse of method 400. In short, the method may start at the moment shown in FIG. 5K and work backwards to the moment shown in FIG. 5E. That is, the unloading method may start with the superstrate 108 being coupled with the superstrate chuck 118, with the superstrate 108 being above the substrate chuck 104. The method of unloading may then proceed to raising the second plurality of pins 134 to the receiving position. Next, the superstrate 108 (being held by the superstrate chuck 118) may be brought into contact with the second plurality of pins 134 (being in the receiving position). After contacting the superstrate 108 with the second plurality of pins 134, the superstrate 108 may be released from the superstrate chuck 118, for example by terminating a vacuum. Then, the distance between the superstrate 108 and the superstrate chuck 118 may be increased by moving one or both of the substrate chuck 118 and the substrate chuck 104 in the Z dimension (or by partially lowering the second plurality of pins 134). After the distance has been increased, the robot arm may enter the space between the superstrate chuck 118 and the superstrate 108 and lift the superstrate 108 from the second plurality of pins 134. Finally, the second plurality of pins 134 may be retracted into the body 114 of the frame 110.

Planarization Process

Figure 7A:
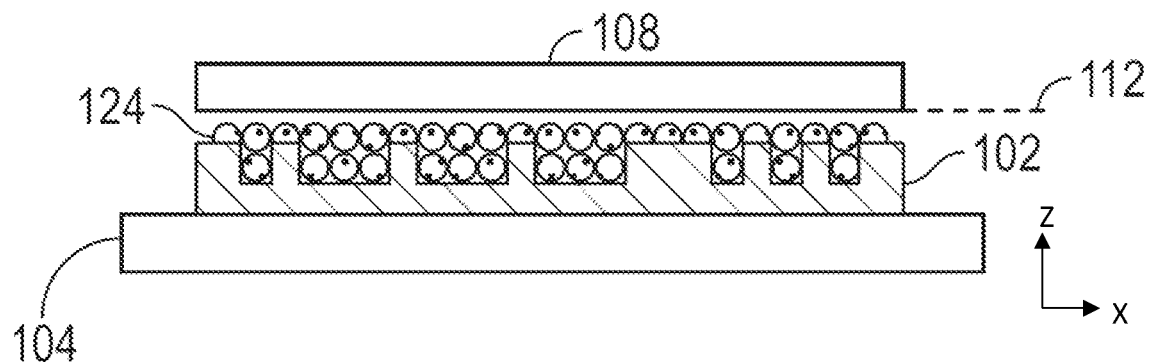
FIGS. 7A to 7C show a schematic cross section of an example planarization process in accordance aspect of the present disclosure.

After the superstrate 108 has been coupled with the superstrate chuck 118 and after the cap substrate has been removed, another substrate 102 may be coupled with the substrate chuck 104 so that the planarization process may begin. The planarization process includes steps which are shown schematically in FIGS. 8A-8C. As illustrated in FIG. 7A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo® NewView® 8200. The local volume density of the deposited formable material 124 is varied depending on the substrate topography. The superstrate 108 is then positioned in contact with the formable material 124.

Figure 7B:
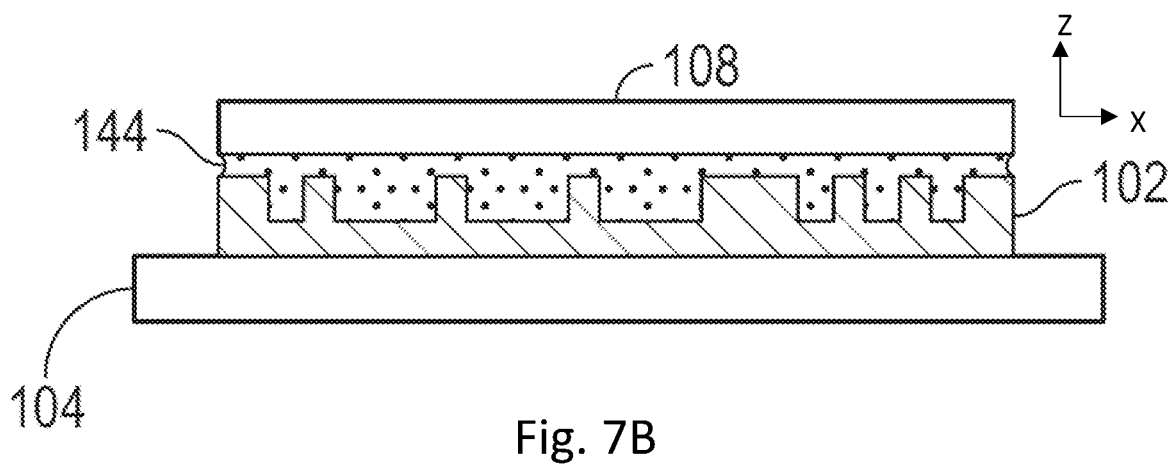

FIG. 7B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom.

Figure 7C:
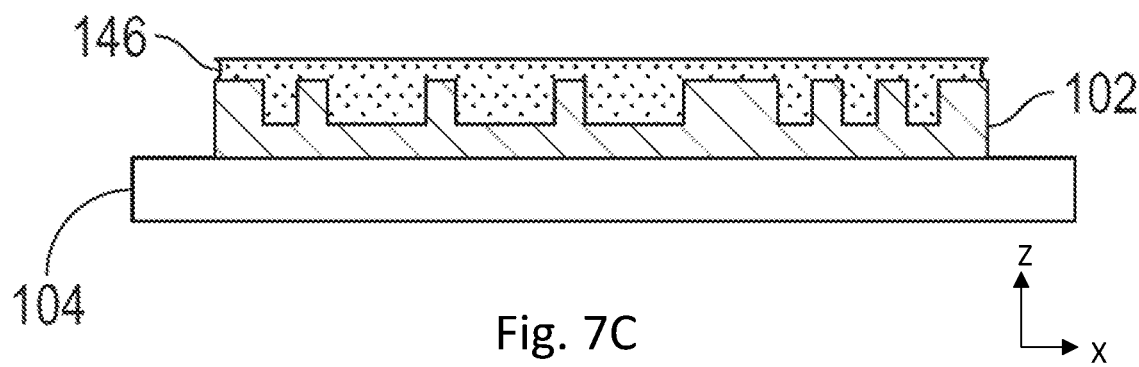

FIG. 7C illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

As a result of the above-described loading method and system it is possible to achieve accurate positioning of the superstrate relative to the superstrate chuck in the X and Y dimension, achieve desired parallelism between the superstrate surface and the superstrate chuck surface, and limiting the amount of force being applied to the robot arm when being used to load the superstrate.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of loading a superstrate onto a superstrate chuck, comprising:
    raising a plurality of pins located radially outward of a substrate chuck from a retracted position to a receiving position;
    placing the superstrate onto the plurality of pins while the plurality of pins are in the receiving position; and
    coupling the superstrate with the superstrate chuck while the superstrate is on the plurality of pins.

2. The method of claim 1, wherein each pin of the plurality of pins are angled toward a center of the superstrate chuck.

3. The method of claim 1,
    wherein each pin of the plurality of pins has a top edge and a bottom edge, and
    wherein, for each pin of the plurality of pins, the top edge is closer to a center of the substrate chuck than the bottom edge.

4. The method of claim 1,
    wherein each pin of the plurality of pins has a longitudinal centerline, and
    wherein an angle between each longitudinal centerline and a horizontal X-Y plane is 10 degrees to 60 degrees.

5. The method of claim 1,
    wherein each pin of the plurality of pins has a top edge and a bottom edge, and
    wherein the top edge of each pin is closer to a center of the substrate chuck in the receiving position than in the retracted position.

6. The method of claim 5, wherein the following formula is satisfied:

$d4 = X \% \, d1$, wherein d1 is a distance between the top edge of each pin and the center of the substrate chuck in the retracted position,
    wherein d4 is a distance between the top edge of each pin and the center of the substrate chuck in the receiving position, and
    wherein X is 93 to 98.

7. The method of claim 1,
    wherein each pin of the plurality of pins has a top edge, and
    wherein placing the superstrate onto the plurality of pins comprises placing the superstrate on the top edge of each pin.

8. The method of claim 1,
    wherein each pin of the plurality of pins has a top edge, and
    wherein, in the receiving position, the top edge of each pin overlaps the substrate chuck.

9. The method of claim 1, further comprising:
    after placing the superstrate on the plurality of pins, further raising the plurality of pins until reaching a chucking position,
    wherein coupling the superstrate with the superstrate chuck occurs at the chucking position.

10. The method of claim 1, further comprising:
    after placing the superstrate on the plurality of pins, moving at least one of the superstrate chuck or the substrate chuck until reaching a chucking position,
    wherein coupling the superstrate with the superstrate chuck occurs at the chucking position.

11. The method of claim 1, wherein the coupling of the superstrate with the superstrate chuck occurs at the receiving position.

12. The method of claim 1, further comprising lifting the superstrate off of the plurality of pins after coupling the superstrate with the superstrate chuck.

13. The method of claim 1, further comprising retracting the plurality of pins until reaching the retracted position after coupling the superstrate with the superstrate chuck.

14. The method of claim 1, further comprising, prior to raising the plurality of pins, loading a substrate onto the substrate chuck.

15. The method of claim 14, wherein loading the substrate onto the substrate chuck comprises raising another plurality of pins.

16. The method of claim 15, wherein the other plurality of pins are located radially inward of the plurality of pins.

17. The system of claim 15, wherein the other plurality of pins are radially aligned.

18. The method of claim 14, further comprising, after coupling the superstrate with the superstrate chuck, unloading the substrate from the substrate chuck.

* * * * *